United States Patent
Na et al.

(10) Patent No.: US 10,845,378 B2
(45) Date of Patent: Nov. 24, 2020

(54) MULTI-SENSOR DEVICE AND METHOD FOR MANUFACTURING MULTI-SENSOR DEVICE

(71) Applicant: ITM SEMICONDUCTOR CO., LTD., Chungcheongbuk-do (KR)

(72) Inventors: Hyuk Hwi Na, Chungcheongbuk-do (KR); Ho Seok Hwang, Gyeonggi-do (KR); Ja Guen Gu, Chungcheongbuk-do (KR); Hyang Won Kang, Chungcheongbuk-do (KR)

(73) Assignee: ITM SEMICONDUCTOR CO., LTD., Chungcheongbuk-do (KR)

( * ) Notice: Subject to any disclaimer, the term of this patent is extended or adjusted under 35 U.S.C. 154(b) by 0 days.

(21) Appl. No.: 16/337,460

(22) PCT Filed: Sep. 29, 2017

(86) PCT No.: PCT/KR2017/010971
§ 371 (c)(1),
(2) Date: Mar. 28, 2019

(87) PCT Pub. No.: WO2018/066929
PCT Pub. Date: Apr. 12, 2018

(65) Prior Publication Data
US 2019/0234989 A1    Aug. 1, 2019

(30) Foreign Application Priority Data
Oct. 4, 2016    (KR) .................. 10-2016-0127787

(51) Int. Cl.
*G01P 15/08*    (2006.01)
*G01P 1/02*    (2006.01)
(Continued)

(52) U.S. Cl.
CPC .............. *G01P 15/08* (2013.01); *D06F 37/30* (2013.01); *D06F 39/08* (2013.01); *G01C 19/56* (2013.01);
(Continued)

(58) Field of Classification Search
CPC .. G01P 15/08; G01P 15/18; G01P 1/02; G01P 1/023
See application file for complete search history.

(56) References Cited

U.S. PATENT DOCUMENTS 6,093,576 A * 7/2000 Otani .................. B81C 1/00269
438/5
2002/0144554 A1 * 10/2002 Ueyanagi .............. G01P 15/123
73/700
(Continued)

FOREIGN PATENT DOCUMENTS

CN    104936428        9/2015
JP    06-112661 A      4/1994
(Continued)

*Primary Examiner* — Helen C Kwok
(74) *Attorney, Agent, or Firm* — Stuart H. Mayer; Mayer & Williams PC (57) ABSTRACT

Provided are a multi-sensor device capable of implementing a pressure sensor function and an acceleration sensor function by using one housing, and a method of manufacturing the multi-sensor device. The multi-sensor device may include a lead frame, a pressure sensing element electrically connected to the lead frame and being capable of measuring a relative pressure between a first part and a second part thereof, an acceleration sensor module electrically connected to the lead frame and being capable of measuring acceleration applied to an ambient environment thereof, and a housing mounted to protect at least a part of the lead frame, the pressure sensing element, and the acceleration sensor module, including a reference medium inlet hole to apply a pressure of a reference medium to the first part, and includ- (Continued)

ing a target medium inlet hole to apply a pressure of a target medium to the second part.

11 Claims, 9 Drawing Sheets

(51) Int. Cl.

| | | |
|---|---|---|
| *G01C 19/5769* | (2012.01) | |
| *H05K 3/30* | (2006.01) | |
| *G01D 11/24* | (2006.01) | |
| *G01D 21/02* | (2006.01) | |
| *H01L 23/495* | (2006.01) | |
| *D06F 39/08* | (2006.01) | |
| *G01C 19/56* | (2012.01) | |
| *D06F 37/30* | (2020.01) | |

(52) U.S. Cl.
CPC ......... *G01C 19/5769* (2013.01); *G01D 11/24* (2013.01); *G01D 11/245* (2013.01); *G01D 21/02* (2013.01); *G01P 1/02* (2013.01); *H01L 23/49575* (2013.01); *H05K 3/301* (2013.01)

(56) References Cited

U.S. PATENT DOCUMENTS

| | | | |
|---|---|---|---|
| 2004/0124384 A1* | 7/2004 | Biegelsen | F16K 99/0051 251/129.01 |
| 2008/0081150 A1* | 4/2008 | Arao | G01P 15/125 428/141 |
| 2012/0299127 A1* | 11/2012 | Fujii | B81B 7/02 257/415 |
| 2015/0102437 A1* | 4/2015 | Liu | G01L 9/0073 257/419 |
| 2015/0258953 A1* | 9/2015 | Murray, Jr. | G01D 11/245 73/493 |
| 2015/0268261 A1* | 9/2015 | Murray, Jr. | H01R 43/16 73/493 |
| 2016/0131678 A1* | 5/2016 | Yaguchi | G01C 19/5783 73/511 |
| 2017/0284880 A1* | 10/2017 | Beer | H01L 23/49811 |
| 2018/0202807 A1* | 7/2018 | Schelling | B81C 1/00357 |

FOREIGN PATENT DOCUMENTS

| | | |
|---|---|---|
| JP | 08-160072 A | 6/1996 |
| JP | 2000-055761 A | 2/2000 |
| KR | 1020070104194 A | 10/2007 |
| KR | 1014865180000 B1 | 1/2015 |

* cited by examiner

MULTI-SENSOR DEVICE AND METHOD FOR MANUFACTURING MULTI-SENSOR DEVICE

TECHNICAL FIELD

The present invention relates to a multi-sensor device and a method of manufacturing the multi-sensor device, and more particularly, to a multi-sensor device capable of implementing a pressure sensor function and an acceleration sensor function by using one housing, and a method of manufacturing the multi-sensor device.

BACKGROUND ART

In general, a washing machine is an apparatus for washing, rinsing, and spin-drying dirty clothes by using a detergent and water supplied into a tub, and a controller of the washing machine includes a pressure sensor capable of appropriately controlling water supply based on a preset water level or a water level manually set by a user.

The pressure sensor has a structure in which a metal coil and a magnetic bar move due to changes in air pressure caused by changes in the level of a target medium, e.g., water, and operates on the principle of frequency oscillation due to changes in inductance.

Pressure sensors used in various pressure measurement systems, e.g., a tire pressure monitoring system (TPMS) for measuring a tire pressure of a vehicle, may operate on the same principle.

As steam washing machines are currently popularized, research is being broadly conducted on a pressure sensor capable of more precisely measuring a water level.

However, a pressure sensor has an output frequency variation sensitivity of several kHz, and an output value thereof changes in the form of a non-linear quadratic curve. Thus, the pressure sensor may not precisely measure a water level. Furthermore, when steam is excessively generated or water is continuously supplied, an excessively high pressure may be caused and the pressure sensor may be damaged or broken in severe cases.

DETAILED DESCRIPTION OF THE INVENTION

Technical Problem

Conventionally, in addition to a pressure sensor, an acceleration sensor is mounted on a bracket mounted on an inner wall of a washing machine to measure shaking of the washing machine, and a connection cable detachably connected to the acceleration sensor, and a cable tie are used to transmit an electrical signal generated by the acceleration sensor, to a controller of the washing machine.

However, the pressure sensor of the washing machine and the acceleration sensor mounted separately from the pressure sensor occupy much space inside the washing machine, cause an increase in the number of components due to additional components for fixing the sensors, and thus increase costs of products.

Furthermore, due to the increase in the number of components, more assembly labor, assembly steps, and assembly time are required to assemble the components and thus productivity is greatly reduced.

The present invention provides a multi-sensor device and a method of manufacturing the multi-sensor device, by which firm assembly and excellent durability may be achieved by directly connecting a lead frame to a wire connector, production costs of products may be reduced by reducing the number of components based on a multi-use component by mounting an acceleration sensor module in a housing of a pressure sensor device, productivity may be increased by saving working labor, working steps, and a working time, and multiple functions may be performed by precisely measuring, for example, a water level of a washing machine or a tire pressure and, at the same time, measuring an acceleration. However, the scope of the present invention is not limited thereto.

Technical Solution

According to an aspect of the present invention, there is provided a multi-sensor device including a lead frame, a pressure sensing element electrically connected to the lead frame and being capable of measuring a relative pressure between a first part and a second part thereof, an acceleration sensor module electrically connected to the lead frame and being capable of measuring acceleration applied to an ambient environment thereof, and a housing mounted to protect at least a part of the lead frame, the pressure sensing element, and the acceleration sensor module, including a reference medium inlet hole to apply a pressure of a reference medium to the first part, and including a target medium inlet hole to apply a pressure of a target medium to the second part.

The acceleration sensor module may include a printed circuit board (PCB) including a wiring layer on a top surface thereof and including a pad electrically connected to the wiring layer, on a bottom surface thereof, and an acceleration sensing element mounted on the wiring layer of the PCB.

The lead frame may include leads extending to outside of the housing, and insertion terminals sharply protruding from front ends of the leads so as to be inserted into and be electrically connected to terminal holes of a wire connector.

The pad of the PCB may be mounted on the leads.

The housing may include a first housing including a reference medium inlet hole and a target medium inlet hole in different directions, having a first internal area connected to the reference medium inlet hole and a second internal area connected to the target medium inlet hole, and mounted at a side of the lead frame, a second housing having a third internal area for allowing the reference medium of the first internal area to reach the first part through the lead frame, and mounted at another side of the lead frame, and a molded member including an opening for exposing the first part of the pressure sensing element to the reference medium, and at least one barrier for defining the first and second internal areas, and molded to a shape surrounding the part of the lead frame.

An adhesive sealing member may be provided between the molded member and the first housing and between the molded member and the second housing.

The molded member may include wings provided between neighboring insertion terminals of the lead frame and inserted into wing holes of the wire connector to prevent a short circuit.

A pressure transmission medium may be provided on the second part of the pressure sensing element to protect the pressure sensing element and to transmit the pressure of the target medium to the second part.

The pressure transmission medium may have a waterproof function to prevent direct contact between the target medium and the pressure sensing element.

The pressure transmission medium may include gel having a variable shape depending on the pressure of the target medium.

The pressure transmission medium may include silicone or epoxy having a variable shape depending on the pressure of the target medium.

The multi-sensor device may further include a pressure sensor integrated chip (IC) for converting an analog signal output from the pressure sensing element, into a digital signal.

The molded member may include, at a part thereof, a first guide for guiding the reference medium supplied from the reference medium inlet hole, in a first direction, and a second guide for guiding the reference medium in a second direction opposite to the first direction, toward the pressure sensing element.

According to another aspect of the present invention, there is provided a method of manufacturing a multi-sensor device, the method including a lead frame strip preparation operation for preparing a lead frame strip including a plurality of unit lead frames, an acceleration sensor module preparation operation for preparing a plurality of acceleration sensor modules, an acceleration sensor module mounting operation for mounting the plurality of acceleration sensor modules on leads of the unit lead frames of the lead frame strip, a molding operation for molding the mounted acceleration sensor modules with a plurality of molded members to protect the acceleration sensor modules, a pressure sensing element mounting operation for mounting a plurality of pressure sensing elements and a plurality of pressure sensor integrated chips (ICs) near exposed parts of the lead frames, a pressure transmission medium coating operation for coating a pressure transmission medium on the mounted pressure sensing elements and the pressure sensor ICs, a housing attachment operation for coating an adhesive sealing member on both surfaces of the plurality of molded members and attaching a first housing and a second housing 32 to each of the molded members, and a trimming operation for cutting the lead frame strip into the unit lead frames.

The lead frame strip preparation operation may include a raw plate preparation operation for preparing a raw strip plate, a primary plating operation for plating a corrosion-resistant metal layer on the raw strip plate, and a secondary plating operation for plating a wire bonding pad layer on parts of the corrosion-resistant metal layer.

The acceleration sensor module preparation operation may include a substrate strip preparation operation for preparing a printed circuit board (PCB) strip, an element mounting operation for mounting a plurality of acceleration sensing elements on the PCB strip, and an individual modularization operation for cutting the PCB strip into unit modules.

The pressure sensing element mounting operation may include an adhesion operation for adhering the plurality of pressure sensing elements and the plurality of pressure sensor ICs near the exposed parts of the lead frames by using an adhesive, and a wire bonding operation for bonding wires between the lead frames, the pressure sensing elements, and the pressure sensor ICs.

Advantageous Effects

As described above, according to an embodiment of the present invention, firm assembly and excellent durability may be achieved, production costs of products may be reduced by reducing the number of components based on a multi-use component by mounting an acceleration sensor module in a housing of a pressure sensor device, productivity may be increased by saving working labor, working steps, and a working time, and multiple functions may be performed by precisely measuring, for example, a water level of a washing machine or a tire pressure and, at the same time, measuring an acceleration. However, the scope of the present invention is not limited to the above effects.

BEST MODE

Hereinafter, the present invention will be described in detail by explaining embodiments of the invention with reference to the attached drawings. The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art. In the drawings, the sizes of elements may be exaggerated or reduced for convenience of explanation.

Embodiments of the invention are described herein with reference to schematic illustrations of idealized embodiments (and intermediate structures) of the invention. As such, variations from the shapes of the illustrations as a result, for example, of manufacturing techniques and/or tolerances, are to be expected. Thus, the embodiments of the invention should not be construed as limited to the particular shapes of areas illustrated herein, but are to include deviations in shapes that result, for example, from manufacturing.

Figure 1:
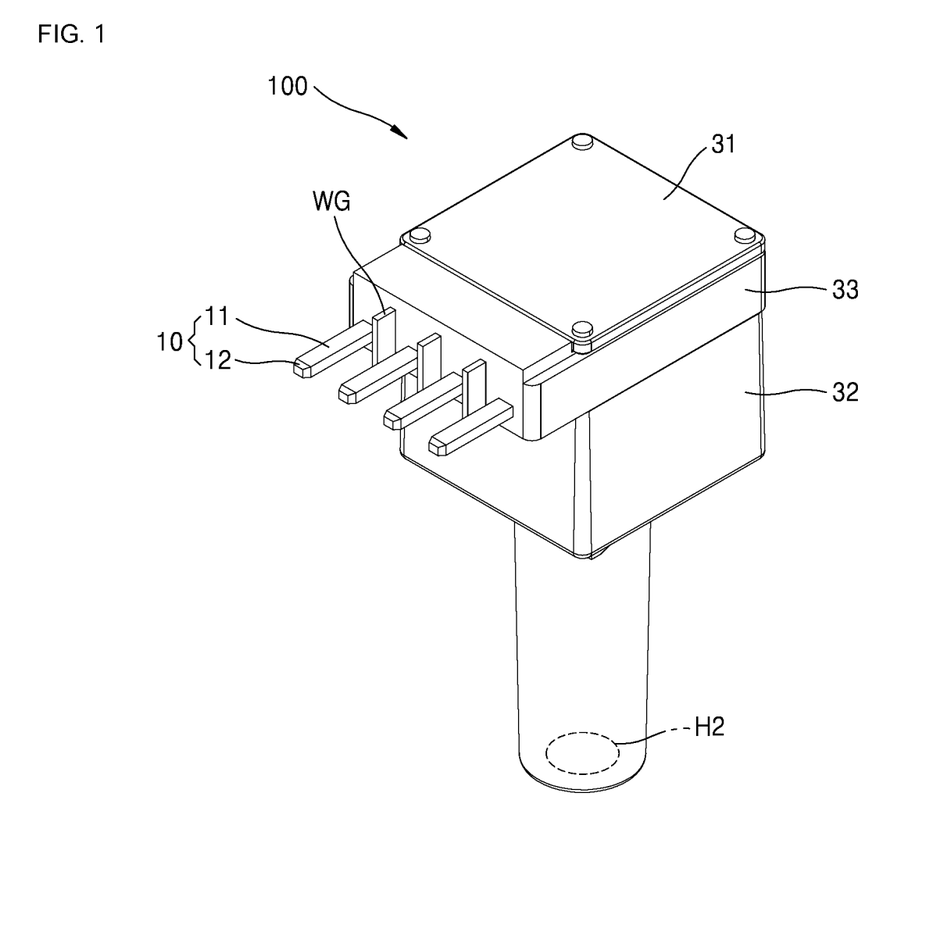
FIG. 1 is an external perspective view of a multi-sensor device according to some embodiments of the present invention.
Figure 2:
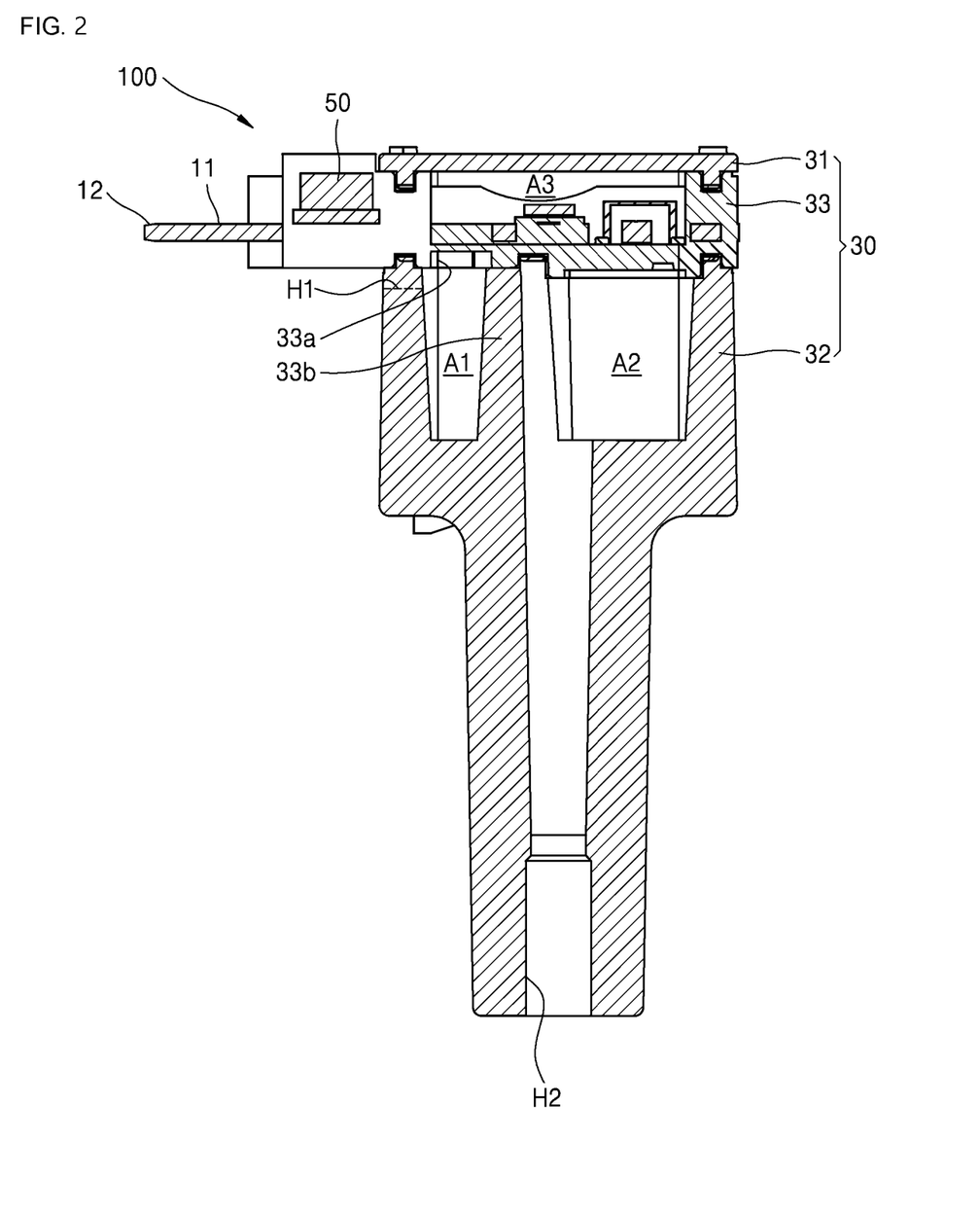
FIG. 2 is a cross-sectional view of the multi-sensor device of FIG. 1.
Figure 3:
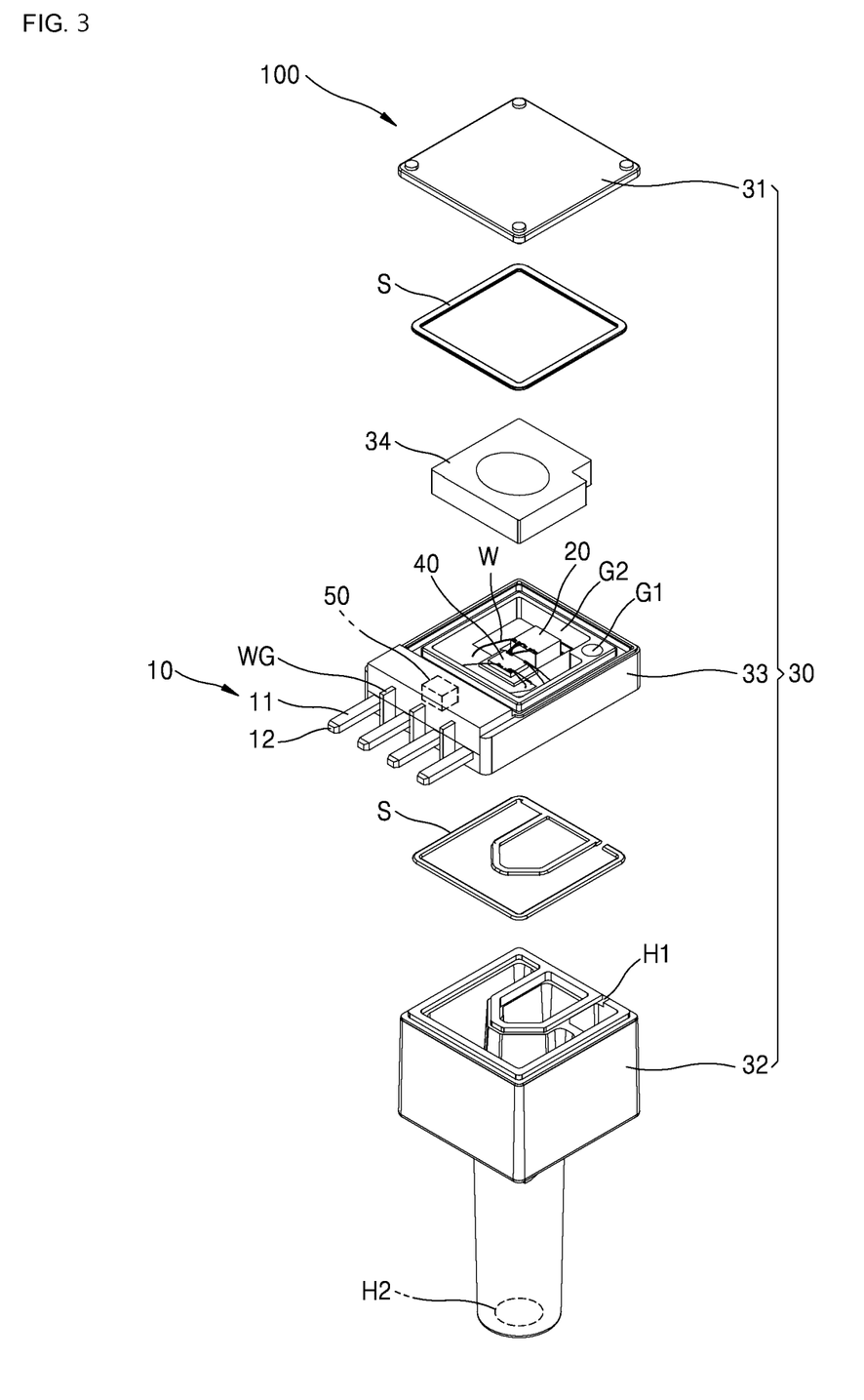
FIG. 3 is an exploded perspective view of the multi-sensor device of FIG. 1.
Figure 4:
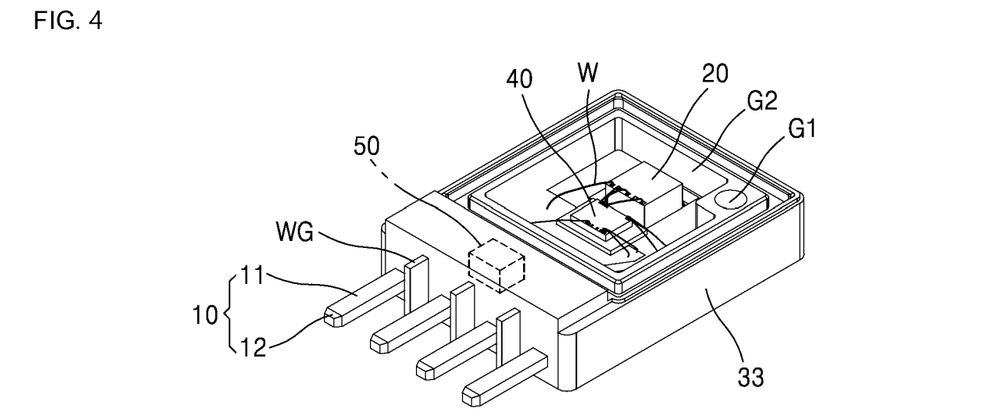
FIG. 4 is a magnified perspective view of a molded member of the multi-sensor device of FIG. 3.
Figure 5:
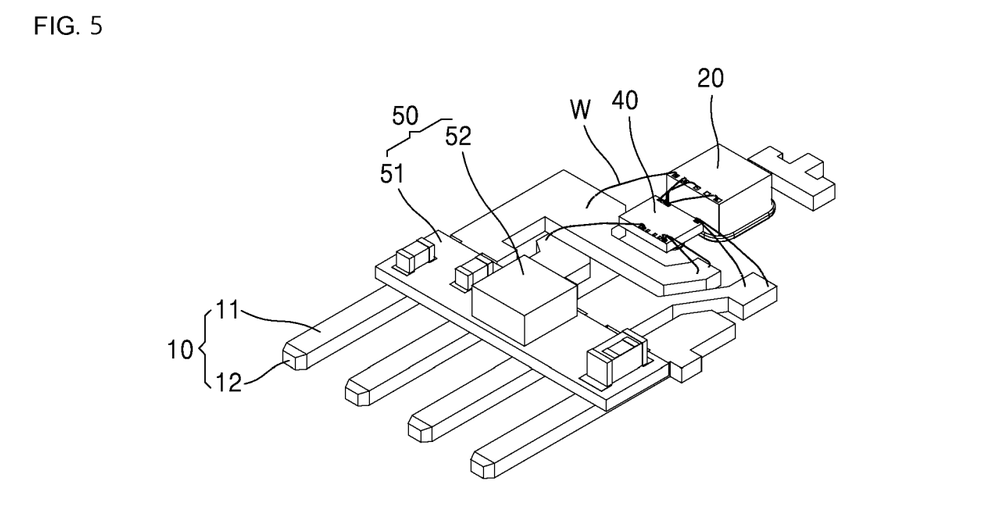
FIG. 5 is a perspective view of a lead frame of the multi-sensor device of FIG. 4.
Figure 6:
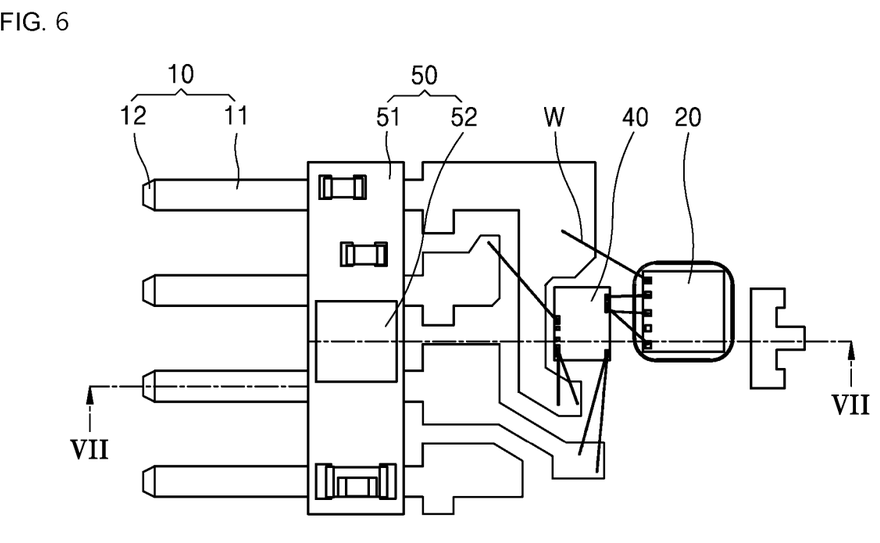
FIG. 6 is a plan view of the lead frame of the multi-sensor device of FIG. 5.
Figure 7:
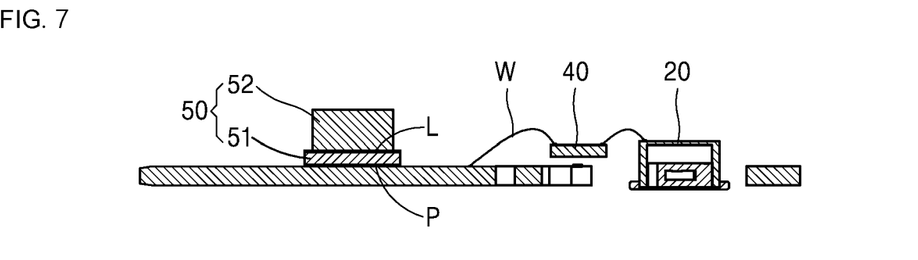
FIG. 7 is a cross-sectional view taken along a line VII-VII of the multi-sensor device of FIG. 6.

FIG. 1 is an external perspective view of a multi-sensor device 100 according to some embodiments of the present invention. FIG. 2 is a cross-sectional view of the multi-sensor device 100 of FIG. 1, FIG. 3 is an exploded perspective view of the multi-sensor device 100 of FIG. 1. FIG. 4 is a magnified perspective view of a molded member 33 of the multi-sensor device 100 of FIG. 3, FIG. 5 is a perspective view of a lead frame 10 of the multi-sensor device 100 of FIG. 4, FIG. 6 is a plan view of the lead frame 10 of the multi-sensor device 100 of FIG. 5, and FIG. 7 is a cross-sectional view taken along a line VII-VII of the multi-sensor device 100 of FIG. 6.

Initially, as illustrated in FIGS. 1 to 7, the multi-sensor device 100 according to some embodiments of the present invention may mainly include the lead frame 10, a pressure sensing element 20, an acceleration sensor module 50, a pressure sensor integrated chip (IC) 40, and a housing 30.

For example, as illustrated in FIGS. 1 to 7, the lead frame 10 may be a metal frame structure which includes leads 11 partially located in a housing 30 and partially extending to the outside of the housing 30, and one or more (e.g., four in FIGS. 1 to 7) insertion terminals 12 extending from the leads 11 so as to be inserted into terminal holes of a wire connector (not shown) and be electrically connected to wires, and is produced using a conductive material, e.g., copper or aluminum, having a uniform thickness and a thin plate shape.

Unlike a conventional lead frame for soldering, the lead frame 10 may have sufficient durability and rigidity and thus may not be damaged or broken even when repeatedly inserted into and pulled out from the terminal holes of the wire connector.

Specifically, for example, as illustrated in FIGS. 1 and 7, the insertion terminals 12 may have pointed tips at front ends thereof and thus may be easily inserted into the terminal holes of the wire connector.

Therefore, the insertion terminals 12 may reduce friction and insertion resistance against the wire connector while being inserted into the terminal holes of the wire connector, and thus a user may easily perform the insertion operation.

For example, the pressure sensing element 20 may be a pressure sensor electrically connected to the lead frame 10 and being capable of measuring a relative pressure between a first part (e.g., an upper part in FIG. 2) and a second part (e.g., a lower part in FIG. 2) thereof.

Specifically, for example, the pressure sensing element 20 may be understood as an element including a diaphragm and capable of outputting an analog signal indicating a pressure applied to the diaphragm or a displacement of the diaphragm, by using various sensors such as a magnetic field sensor, a magnetic sensor, a proximity sensor, a resistance sensor, a reactance sensor, or a strain gauge. However, the pressure sensing element 20 is not limited thereto and all pressure sensing elements capable of outputting measured pressure signals as analog signals or digital signals may be used.

Herein, the pressure sensing element 20 may be electrically connected to the lead frame 10 by various signal transmission media such as wires W, bumps, and solders.

For example, as illustrated in FIGS. 1 to 7, the acceleration sensor module 50 is electrically connected to the lead frame 10, is capable of measuring acceleration applied to an ambient environment thereof, and may include a printed circuit board (PCB) 51 including a wiring layer L on a top surface thereof and including a pad P electrically connected to the wiring layer L, on a bottom surface thereof, and an acceleration sensing element 52 mounted on the wiring layer L of the PCB 51.

Herein, the acceleration sensing element 52 is an element capable of instantaneously detecting physical force such as acceleration, vibration, or impact and outputting the detected physical force as an electrical signal, and various sensing elements such as a vibration sensing element, a gyro sensing element, a tilt sensing element, a uniaxial acceleration sensing element, and a multiaxial acceleration sensing element may be used.

Specifically, for example, as illustrated in FIGS. 1 to 7, in the multi-sensor device 100 according to some embodiments of the present invention, the pad P of the PCB 51 may be mounted on the leads 11 such that a pressure measurement function and an acceleration measurement function may be performed simultaneously.

For example, as illustrated in FIGS. 1 to 7, the pressure sensor IC 40 may be an IC chip electrically connected to the lead frame 10 and the pressure sensing element 20 and capable of converting the analog signal output from the pressure sensing element 20, into a digital signal.

The pressure sensor IC 40 may be understood as, for example, an analog front end.

Therefore, the pressure sensor IC 40 may convert the analog signal output from the pressure sensing element 20, into a digital signal having less noise and transmit the digital signal through the lead frame 10 to an external device. As such, the external device may receive a more precise pressure signal.

The multi-sensor device 100 according to some embodiments of the present invention may further include a regulator (not shown) capable of constantly maintaining a voltage level. The regulator may be understood as, for example, a low dropout (LDO) regulator. Herein, the regulator may or may not be used depending on a combination of a sensor and an IC. The regulator is known well and a detailed description thereof will not be provided herein.

For example, as illustrated in FIGS. 1 to 7, the housing 30 is a case mounted to surround and protect at least a part of the lead frame 10, the pressure sensing element 20, the acceleration sensor module 50, and the pressure sensor IC 40, and may be a box-shaped structure including a reference medium inlet hole H1 to apply a pressure of a reference medium to the first part, and including a target medium inlet hole H2 to apply a pressure of a target medium to the second part.

Specifically, for example, as illustrated in FIGS. 1 to 7, the housing 30 may include a first housing 31, a second housing 32, and a molded member 33.

For example, the first housing 31 may include the reference medium inlet hole H1 and the target medium inlet hole H2 in different directions, have a first internal area A1 connected to the reference medium inlet hole H1 and a second internal area A2 connected to the target medium inlet hole H2, and be mounted at a side of the lead frame 10.

In the first housing 31, the reference medium inlet hole H1 and the target medium inlet hole H2 may extend in perpendicular directions.

The reference medium inlet hole H1 and the target medium inlet hole H2 may have equal inner diameters, or one of the reference medium inlet hole H1 and the target medium inlet hole H2 may have a larger diameter than the other.

Therefore, using the first housing 31 in which the pressure of the reference medium and the pressure of the target medium are transmitted in perpendicular directions and influence each other as least as possible, the pressures of the reference medium and the target medium may be independently transmitted without influencing each other and thus may always be accurately and precisely measured in any environment or situation.

For example, the second housing 32 may have a third internal area A3 for allowing the reference medium of the first internal area A1 to reach the first part through the lead frame 10, and may be mounted at the other side of the lead frame 10.

For example, the molded member 33 may include an opening 33a for exposing the first part of the pressure sensing element 20 to the reference medium, and at least one barrier 33b for defining the first and second internal areas A1 and A2, and may be molded to a shape surrounding the part of the lead frame 10.

Herein, as illustrated in FIG. 2, an adhesive sealing member S may be provided between the molded member 33 and the first housing 31 and between the molded member 33 and the second housing 32 not only to fix and firmly assemble the first housing 31, the molded member 33, and the second housing 32 to each other but also to define the first, second, and third internal areas A1, A2, and A3 as separate areas.

For example, as illustrated in FIGS. 1 to 7, the molded member 33 may include wings WG provided between neighboring insertion terminals 12 of the lead frame 10 and inserted into wing holes WH of the wire connector to prevent a short circuit.

For example, as illustrated in FIGS. 1 to 7, the molded member 33 may include, at a part thereof, a first guide G1 for guiding the reference medium supplied from the reference medium inlet hole H1, in a first direction, and a second guide G2 for guiding the reference medium in a second direction opposite to the first direction, toward the pressure sensing element 20.

Therefore, when the molded member 33 is assembled to the wire connector, the wings WG may be inserted into the wing holes WH and thus a short circuit between or an insertion error or malfunction of the insertion terminals 12 may be completely prevented. The molded member 33 may be separately molded or insert-molded.

For example, as illustrated in FIGS. 1 to 7, a pressure transmission medium 34 may be molded on the second part of the pressure sensing element 20 between the molded member 33 and the lead frame 10 to protect the pressure sensing element 20 and to transmit the pressure of the target medium to the second part.

Specifically, for example, the pressure transmission medium 34 has a waterproof function to prevent direct contact between the target medium and the pressure sensing element 20, and may include gel, silicone, or epoxy having a variable shape depending on the pressure of the target medium.

For example, the pressure transmission medium 34 may use a silicone-based material (having a Young s modulus value of 0.001 GPa to 0.05 GPa) or an epoxy-based material (having a Young's modulus value of 2.0 GPa to 20.0 GPa), which is used to protect a semiconductor IC and a microelectromechanical system (MEMS) sensor. The both materials have excellent waterproof functions, and the silicone-based material has a pressure transmission function superior to that of the epoxy-based material due to a difference in the Young's modulus values of the materials. The Young's modulus value is a longitudinal elastic modulus, and a material having a small Young's modulus value contracts well and transmits pressure well.

The materials may be used in the form of gel capable of performing a waterproof function and a function of transmitting a pressure of a fluid to the pressure sensing element 20 including the diaphragm. The gel indicates a state in which a colloidal solution is solidified like jelly to a certain density or above, and a pressure applied thereto may be transmitted to the pressure sensing element 20.

Therefore, when the pressure of the target medium, e.g., water supplied to a washing machine or air filled in a tire, is transmitted to the pressure transmission medium 34 and thus the pressure transmission medium 34 is deformed, the deformation may be indirectly transmitted to the pressure sensing element 20 and thus a pressure value may be accurately and precisely measured without causing corrosion or damage of components.

That is, as illustrated in FIG. 2, the multi-sensor device 100 according to some embodiments of the present invention operates as described below. Initially, the reference medium serving as a basis for pressure measurement, e.g., the air, may be supplied through the reference medium inlet hole H1 into the first internal area A1 of the first housing 31 in a horizontal direction.

Then, the reference medium may reach the third internal area A3 of the second housing 32 through the opening 33a of the molded member 33 and the first guide G1 of the molded member 33.

Subsequently, the reference medium may reach the first part of the pressure sensing element 20 through the second guide G2 of the molded member 33 and apply a reference pressure to the pressure sensing element 20.

As illustrated in FIG. 1, the target medium serving as a target for pressure measurement, e.g., water supplied to a washing machine or air filled in a tire, may be supplied through the target medium inlet hole H2 into the second internal area A2 of the first housing 31 in a vertical direction.

The vertical direction in which the target medium is supplied is perpendicular to the horizontal direction in which the reference medium is supplied and thus the two media may apply hydraulic pressures as independently as possible without influencing each other.

Then, the target medium may reach the pressure transmission medium 34, and the pressure transmission medium 34 may transmit the pressure to the second part of the pressure sensing element 20 and apply a target pressure to be measured by the pressure sensing element 20.

Accordingly, firm assembly and excellent durability may be achieved by directly connecting the lead frame 10 to the wire connector, production costs of products may be reduced and productivity may be increased by omitting, for example, a substrate or a bracket, not only a water level of a washing machine and a tire pressure but also acceleration and vibration may be precisely measured, a small product size may be achieved, water and electricity may be saved by precisely controlling a water level, and damage due to a target medium, e.g., water supplied to a washing machine or air filled in a tire, may be prevented.

Figure 8:
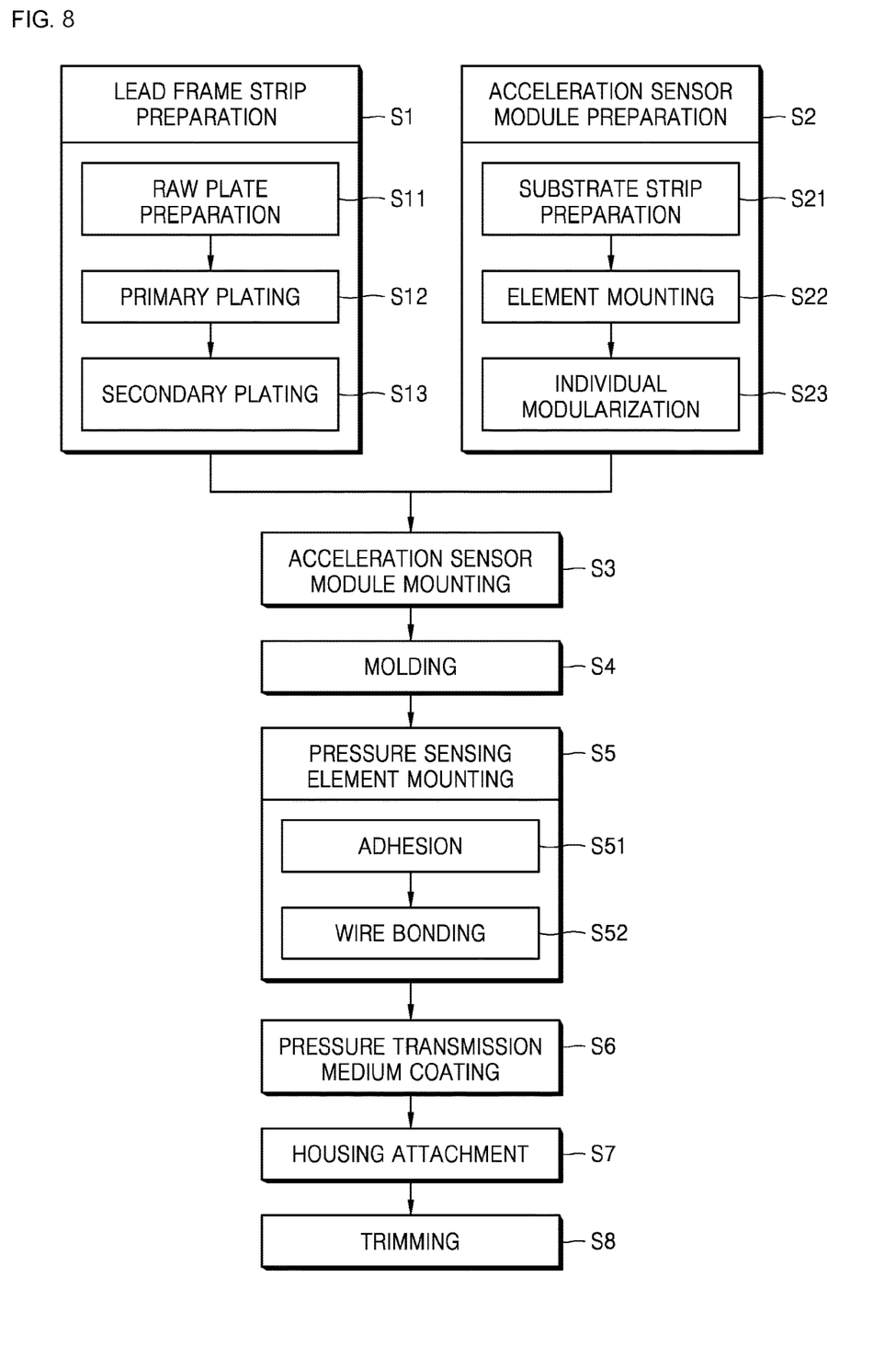
FIG. 8 is a flowchart of a method of manufacturing a multi-sensor device, according to some embodiments of the present invention.

FIG. 8 is a flowchart of a method of manufacturing the multi-sensor device 100, according to some embodiments of the present invention. FIGS. 9 to 14 are plan and perspective views sequentially illustrating operations of the method of FIG. 8.

As illustrated in FIGS. 1 to 14, the method of manufacturing the multi-sensor device 100, according to some embodiments of the present invention, may mainly include a lead frame strip preparation operation S1, an acceleration sensor module preparation operation S2, an acceleration sensor module mounting operation S3, a molding operation S4, a pressure sensing element mounting operation S5, a pressure transmission medium coating operation S6, a housing attachment operation S7, and a trimming operation S8.

Figure 9:
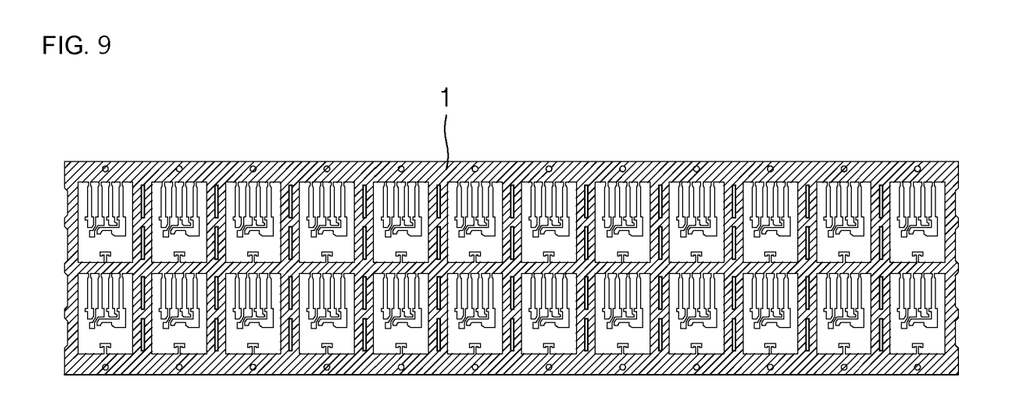
FIGS. 9 to 14 are plan and perspective views sequentially illustrating operations of the method of FIG. 8.

Initially, for example, as illustrated in FIGS. 8 and 9, the lead frame strip preparation operation S1 may be an operation for preparing a lead frame strip RS including a plurality of unit lead frames.

Figure 10:
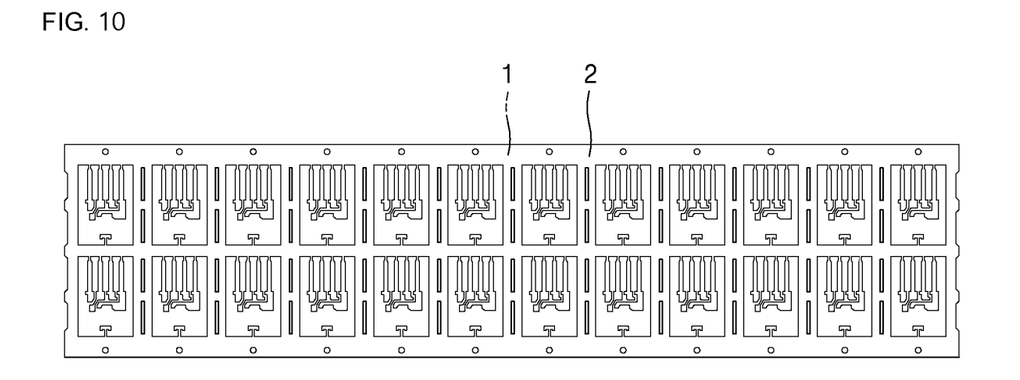
Figure 11:
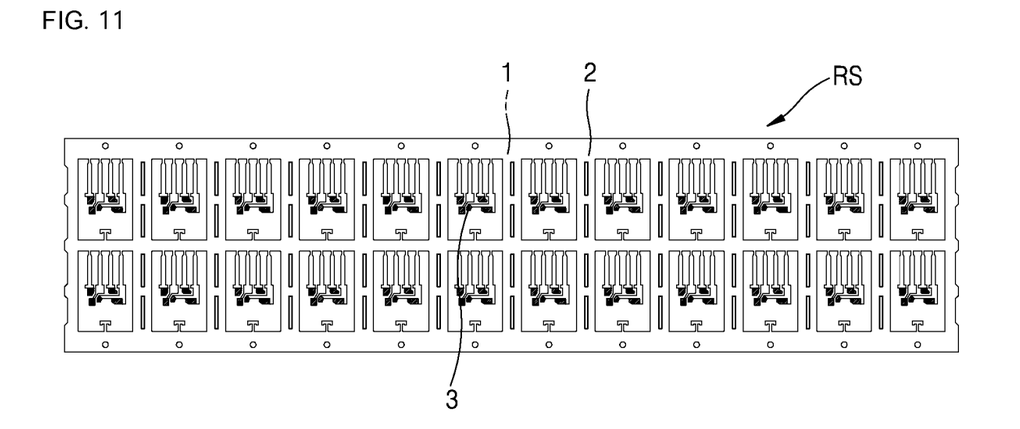

Herein, specifically, for example, the lead frame strip preparation operation S1 may include a raw plate preparation operation S11 for preparing a raw strip plate 1 as illustrated in FIG. 9, a primary plating operation S12 for plating a corrosion-resistant metal layer 2 on the raw strip plate 1 as illustrated in FIG. 10, and a secondary plating operation S13 for plating a wire bonding pad layer 3 on parts of the corrosion-resistant metal layer 2 as illustrated in FIG. 11.

Figure 12:
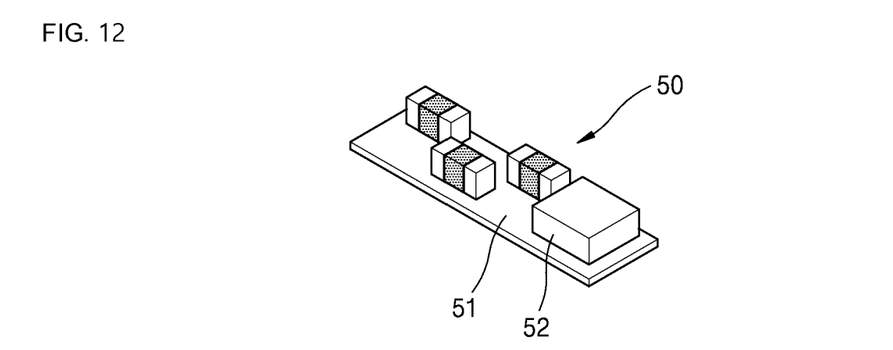

As illustrated in FIGS. 8 and 12, for example, the acceleration sensor module preparation operation S2 may be an operation for preparing a plurality of acceleration sensor modules 50.

Herein, specifically, for example, the acceleration sensor module preparation operation S2 may include a substrate strip preparation operation S21 for preparing a PCB strip 4, an element mounting operation S22 for mounting a plurality of acceleration sensing elements 52 on the PCB strip 4, and an individual modularization operation S23 for cutting the PCB strip 4 into unit modules 50.

Figure 13:
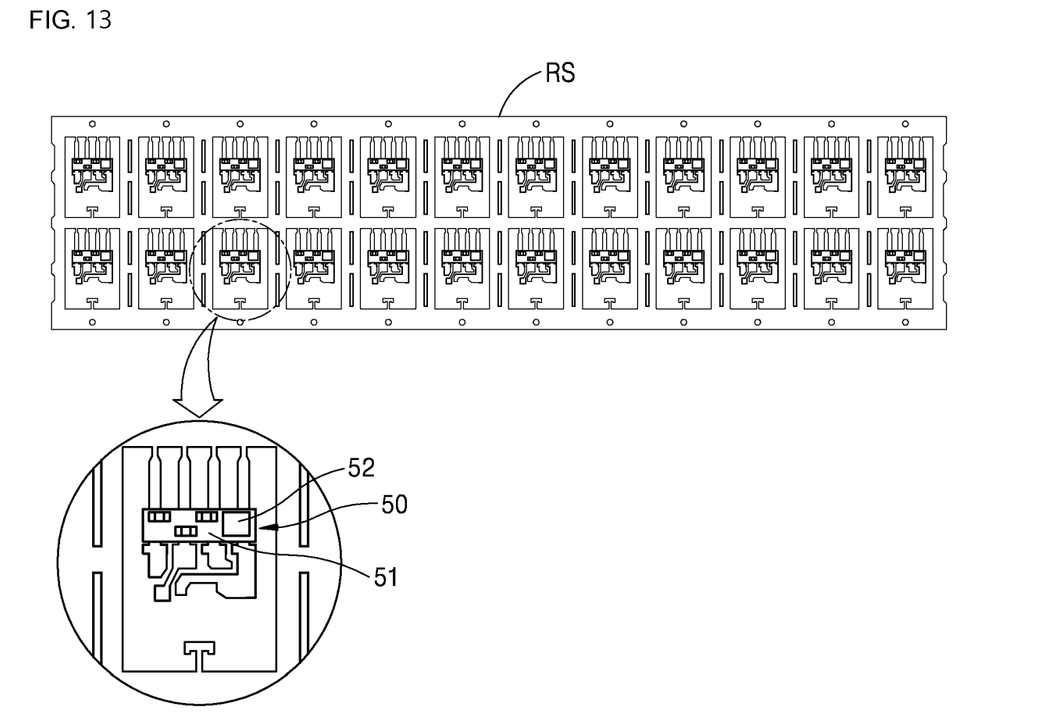

Then, as illustrated in FIG. 13, the acceleration sensor module mounting operation S3 may be an operation for mounting the plurality of acceleration sensor modules 50 on the leads 11 of the unit lead frames of the lead frame strip RS.

Figure 14:
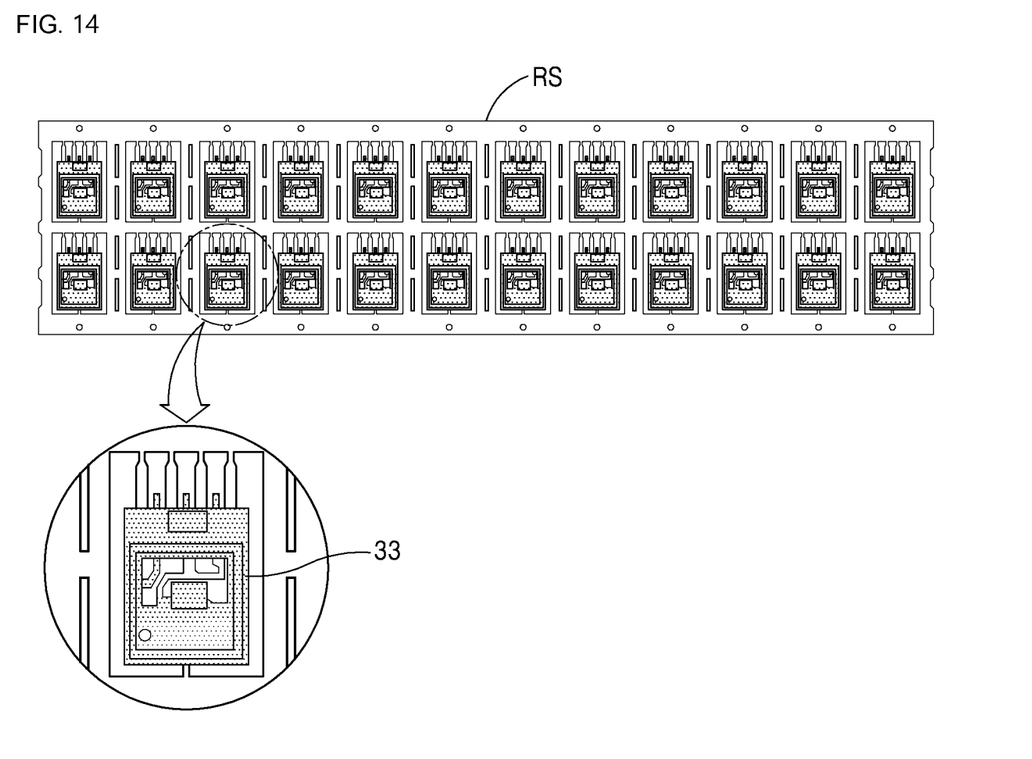

Thereafter, as illustrated in FIG. 14, the molding operation S4 may be an operation for molding the mounted acceleration sensor modules 50 with a plurality of molded members 33 to protect the acceleration sensor modules 50.

Subsequently, the pressure sensing element mounting operation S5 may be an operation for mounting a plurality of pressure sensing elements 20 and a plurality of pressure sensor ICs 40 near exposed parts of the lead frames 10.

Herein, specifically, for example, the pressure sensing element mounting operation S5 may include an adhesion operation S51 for adhering the plurality of pressure sensing elements 20 and the plurality of pressure sensor ICs 40 near the exposed parts of the lead frames 10 by using an adhesive, and a wire bonding operation S52 for bonding the wires W between the lead frames 10, the pressure sensing elements 20, and the pressure sensor ICs 40.

Then, the pressure transmission medium coating operation S6 may be an operation for coating the pressure transmission medium 34 on the mounted pressure sensing elements 20 and the pressure sensor ICs 40.

Thereafter, the housing attachment operation S7 may be an operation for coating the adhesive sealing member S on both surfaces of the plurality of molded members 33 and attaching the first housing 31 and the second housing 32 to each of the molded members 33.

Subsequently, the trimming operation S8 may be an operation for cutting the lead frame strip RS into the unit lead frames.

While the present invention has been particularly shown and described with reference to embodiments thereof, it will be understood by one of ordinary skill in the art that various changes in form and details may be made therein without departing from the spirit and scope of the present invention as defined by the following claims.

INDUSTRIAL APPLICABILITY

As described above, according to an embodiment of the present invention, firm assembly and excellent durability may be achieved, production costs of products may be reduced by reducing the number of components based on a multi-use component by mounting an acceleration sensor module in a housing of a pressure sensor device, and productivity may be increased by saving working labor, working steps, and a working time.

The invention claimed is:

1. A multi-sensor device comprising:
   a lead frame;
   a pressure sensing element electrically connected to the lead frame and configured to measure a relative pressure between a first part and a second part thereof;
   an acceleration sensor module electrically connected to the lead frame and configured to measure acceleration applied to an ambient environment thereof; and
   a housing mounted to protect at least a part of the lead frame, the pressure sensing element, and the acceleration sensor module, comprising a reference medium inlet hole to apply a pressure of a reference medium to the first part, and comprising a target medium inlet hole to apply a pressure of a target medium to the second part,
   wherein the housing comprises
   a first housing comprising the reference medium inlet hole and the target medium inlet hole in different directions, having a first internal area connected to the reference medium inlet hole and a second internal area connected to the target medium inlet hole, and mounted at a side of the lead frame, such that the pressures of the reference medium and the target medium are independently transmitted without influencing each other;
   a second housing having a third internal area for allowing the reference medium of the first internal area to reach the first part through the lead frame, and mounted at another side of the lead frame; and
   a molded member comprising an opening for exposing the first part of the pressure sensing element to the reference medium, and at least one barrier for defining the first and second internal areas, and molded to a shape surrounding the part of the lead frame, and
   wherein the molded member comprises, at a part thereof, a first guide for guiding the reference medium supplied from the reference medium inlet hole, in a first direction, and a second guide for guiding the reference medium in a second direction opposite to the first direction, toward the pressure sensing element.

2. The multi-sensor device of claim 1, wherein the acceleration sensor module comprises:
   a printed circuit board (PCB) comprising a wiring layer on a top surface thereof and comprising a pad electrically connected to the wiring layer, on a bottom surface thereof; and
   an acceleration sensing element mounted on the wiring layer of the PCB.

3. The multi-sensor device of claim 2, wherein the lead frame comprises:
   leads extending to outside of the housing; and
   insertion terminals sharply protruding from front ends of the leads so as to be inserted into and be electrically connected to terminal holes of a wire connector.

4. The multi-sensor device of claim 3, wherein the pad of the PCB is mounted on the leads.

5. The multi-sensor device of claim 1, wherein an adhesive sealing member is provided between the molded member and the first housing and between the molded member and the second housing.

6. The multi-sensor device of claim 3, wherein the molded member comprises wings provided between neighboring insertion terminals of the lead frame and inserted into wing holes of the wire connector to prevent a short circuit.

7. The multi-sensor device of claim 1, wherein a pressure transmission medium is provided on the second part of the pressure sensing element to protect the pressure sensing element and to transmit the pressure of the target medium to the second part.

8. The multi-sensor device of claim 7, wherein the pressure transmission medium has a waterproof function to prevent direct contact between the target medium and the pressure sensing element.

9. The multi-sensor device of claim 8, wherein the pressure transmission medium comprises gel having a variable shape depending on the pressure of the target medium.

10. The multi-sensor device of claim 8, wherein the pressure transmission medium comprises silicone or epoxy having a variable shape depending on the pressure of the target medium.

11. The multi-sensor device of claim 1, further comprising a pressure sensor integrated chip (IC) for converting an analog signal output from the pressure sensing element, into a digital signal.

* * * * *